United States Patent
Yu et al.

(10) Patent No.: US 12,464,784 B2
(45) Date of Patent: Nov. 4, 2025

(54) ISOLATION STRUCTURES OF SEMICONDUCTOR DEVICES

(71) Applicant: GlobalFoundries U.S. Inc., Malta, NY (US)

(72) Inventors: Hong Yu, Clifton Park, NY (US); David Pritchard, Schenectady, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 384 days.

(21) Appl. No.: 18/045,799

(22) Filed: Oct. 11, 2022

(65) Prior Publication Data

US 2024/0120373 A1   Apr. 11, 2024

(51) Int. Cl.
*H10D 62/10*    (2025.01)
*H10D 30/01*    (2025.01)
*H10D 30/83*    (2025.01)
*H10D 62/17*    (2025.01)
*H10D 64/01*    (2025.01)
*H10D 64/27*    (2025.01)

(52) U.S. Cl.
CPC ......... *H10D 62/115* (2025.01); *H10D 30/051* (2025.01); *H10D 30/83* (2025.01); *H10D 62/343* (2025.01); *H10D 64/01* (2025.01); *H10D 64/514* (2025.01)

(58) Field of Classification Search
CPC .... H10D 62/115; H10D 30/051; H10D 30/83; H10D 62/343; H10D 64/01; H10D 64/514; H10D 30/6713; H10D 30/6757; H10D 87/00; H10D 84/014–0142; H10D 84/0151; H10D 84/0153; H10D 84/0188
See application file for complete search history.

(56) References Cited

U.S. PATENT DOCUMENTS

| | | |
|---|---|---|
| 9,917,103 B1 | 3/2018 | Mulfinger et al. |
| 10,580,684 B2 | 3/2020 | Wallner et al. |
| 10,727,108 B2 | 7/2020 | Pritchard et al. |
| 2020/0127013 A1 | 4/2020 | Pritchard et al. |
| 2022/0310514 A1* | 9/2022 | Wei ............... H01L 23/5286 |
| 2024/0032300 A1* | 1/2024 | Liao ............... H10B 51/10 |
| 2024/0395888 A1* | 11/2024 | Pan ............... H10D 84/83 |

* cited by examiner

*Primary Examiner* — Shahed Ahmed
(74) *Attorney, Agent, or Firm* — Francois Pagette

(57) ABSTRACT

A semiconductor device is provided. The semiconductor device includes a substrate, a first gate electrode, a second gate electrode, and an isolation structure. The first gate electrode is over the substrate and the second gate electrode is laterally adjacent thereto. The isolation structure is in contact with the first gate electrode and the second gate electrode.

19 Claims, 5 Drawing Sheets

ISOLATION STRUCTURES OF SEMICONDUCTOR DEVICES

TECHNICAL FIELD

The present disclosure relates generally to semiconductor devices, and more particularly to isolation structures of semiconductor devices and methods of forming the same.

BACKGROUND

Technological advances in the semiconductor integrated circuit (IC) industry have brought about ever-decreasing sized IC chips with a higher density of semiconductor devices. Miniaturization, or the downsizing, of the semiconductor devices in the IC chips has been the key to achieving overall device improvements.

In order to meet the growing needs of the semiconductor industry, semiconductor devices enabling further device miniaturization to form highly functional IC chips on a smaller chip area, and methods of forming the same are provided.

SUMMARY

To achieve the foregoing and other aspects of the present disclosure, isolation structures of semiconductor devices and methods of forming the same are presented.

According to an aspect of the present disclosure, a semiconductor device is provided. The semiconductor device includes a substrate, a first gate electrode, a second gate electrode, and an isolation structure. The first gate electrode is over the substrate and the second gate electrode is laterally adjacent thereto. The isolation structure is in contact with the first gate electrode and the second gate electrode.

According to another aspect of the present disclosure, a semiconductor device is provided. The semiconductor device includes a first column of a plurality of first gate electrodes, a plurality of first doped structures in the first column, a second column of a plurality of second gate electrodes, a plurality of second doped structures in the second column, and an isolation structure. The plurality of first doped structures is arranged in an alternating arrangement configuration of a first doped structure and a first gate electrode in the first column. The plurality of second doped structures is arranged in an alternating arrangement configuration of a second doped structure and a second gate electrode in the second column. The isolation structure is between the first column and the second column and in contact with the plurality of first gate electrodes and the plurality of first doped structures in the first column and with the plurality of second gate electrodes and the plurality of second doped structures in the second column.

According to yet another aspect of the present disclosure, a method of forming a semiconductor device is provided. The method includes forming a first gate electrode and a second gate electrode laterally adjacent to the first gate electrode over a substrate and forming an isolation structure between the first gate electrode and the second gate electrode. The isolation structure extends into the substrate and is in contact with the first gate electrode and the second gate electrode at laterally opposite sides thereof.

BRIEF DESCRIPTION OF THE DRAWINGS

The embodiments of the present disclosure will be better understood from a reading of the following detailed description, taken in conjunction with the accompanying drawings.

Figure 1A:
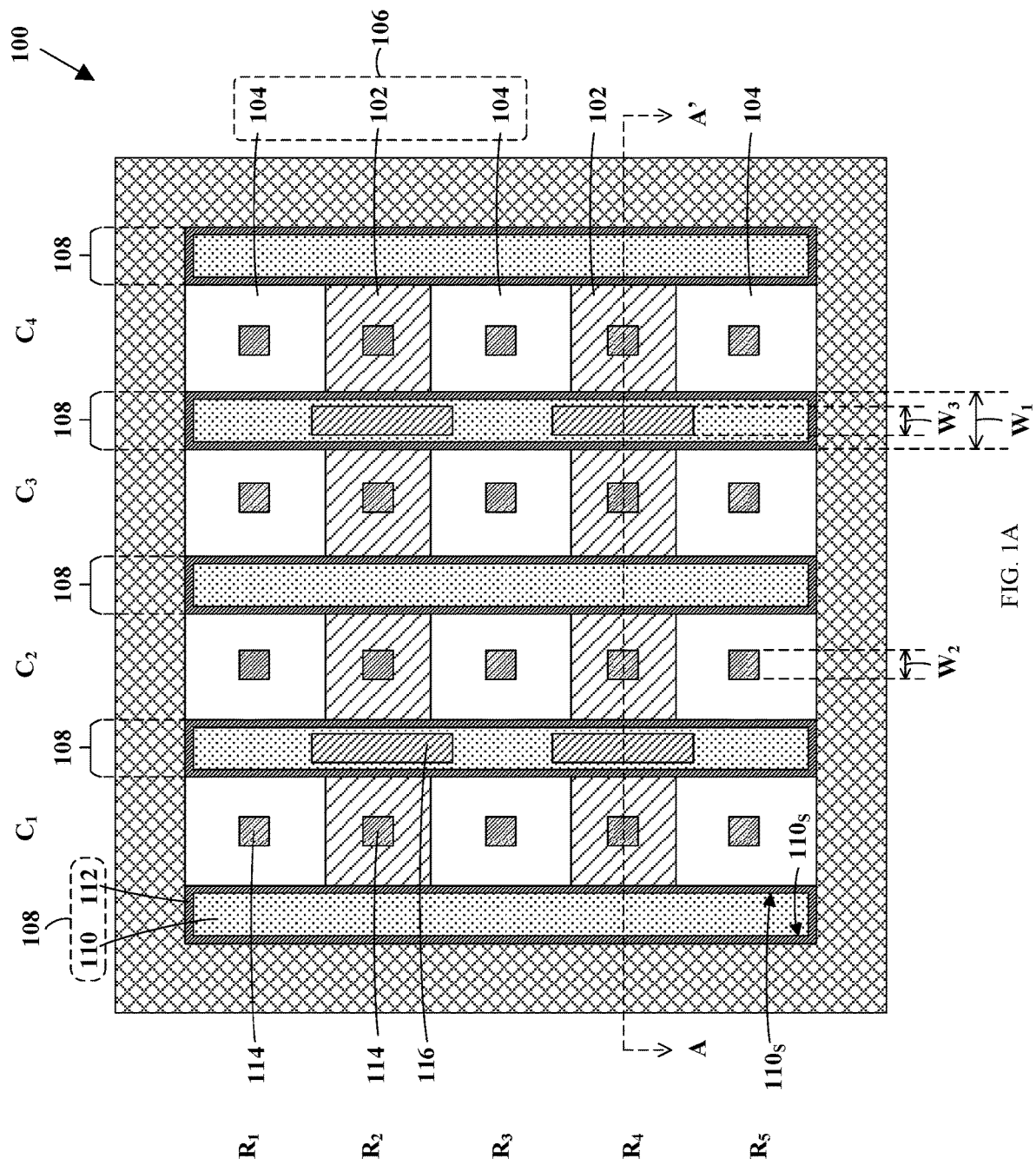
FIG. 1A illustrates a top-down view of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure.

Additionally, features in the drawings are not necessarily drawn to scale. For example, the dimensions of some of the features in the drawings may be exaggerated relative to other features to help improve the understanding of the embodiments of the device. The same reference numerals in different drawings denote the same features, while similar reference numerals may, but do not necessarily, denote similar features.

DETAILED DESCRIPTION

The present disclosure relates to isolation structures of semiconductor devices and methods of forming the same. Various embodiments of the present disclosure are now described in detail with accompanying drawings. It is noted that like and corresponding features are referred to by the use of the same reference numerals. The embodiments disclosed herein are exemplary, and not intended to be exhaustive or limiting to the disclosure.

FIG. 1A is a top-down view of a semiconductor device 100, according to an embodiment of the disclosure. The semiconductor device 100 may include a plurality of gate electrodes 102 and a plurality of doped structures 104 arranged in an array configuration of rows and columns. For example, the array may include five rows $R_1$ through $R_5$ by four columns $C_1$ through $C_4$. The plurality of doped structures 104 may be arranged in odd-numbered rows $R_1$, $R_3$, and $R_5$, while the plurality of gate electrodes 102 may be arranged in even-numbered rows $R_2$ and $R_4$.

Each column, $C_1$ through $C_4$, may include a gate electrode 102 between a pair of doped structures 104. For example, in column $C_1$, three doped structures 104 and two gate electrodes 102 are arranged in an alternating configuration of a doped structure 104 and a gate electrode 102. Each doped structure 104 may serve as either a drain region or a source region, and along with the gate electrode 102 therebetween, function as a transistor 106. Even though FIG. 1A illustrates the array as such, the plurality of gate electrodes 102 and the plurality of doped structures 104 may take on other array configurations without departing from the spirit and scope of the present disclosure.

Each gate electrode 102 may include one or more electrically conductive layers, for example, polycrystalline silicon, amorphous silicon, tantalum, hafnium, copper, silver, cobalt, tungsten, or combinations thereof. In an embodiment of the disclosure, each gate electrode 102 may further include a silicided conductive material, for example, silicided silicon. Each doped structure 104 may include a semiconductor material, for example, silicon or silicon germanium doped with appropriate dopants.

The semiconductor device 100 may further include a plurality of isolation structures 108. Each isolation structure 108 has a width $W_1$. In an embodiment of the disclosure, the width $W_1$ of the isolation structure 108 may be in the range of about 25 nanometers (nm) to about 65 nm.

Each isolation structure 108 may be interposed between columns $C_1$ through $C_4$ and serves to isolate columns $C_1$ through $C_4$ from each other at least electrically. For example, an isolation structure 108 may be arranged between columns $C_1$ and $C_2$, and electrically isolate column $C_1$ from column $C_2$. Each isolation structure 108 may traverse the rows $R_1$ through $R_5$. The isolation structure 108 may be in contact with the gate electrodes 102 and the doped structures 104 in laterally adjacent columns. For example, the isolation structure 108 that separates column $C_2$ from column $C_3$ may isolate the gate electrodes 102 and the doped structures 104 in their corresponding columns $C_2$ and $C_3$ from each other at least electrically.

Each isolation structure 108 may include a dielectric core 110 and a dielectric liner 112 surrounding the dielectric core 110. The dielectric liner 112 may be conformal and may be arranged on at least the side surfaces $110_S$ of the dielectric core 110 along a lengthwise direction thereof. As used herein, the term "lengthwise direction" is a direction along which a feature, such as the isolation structure 108, extends the most.

The dielectric core 110 may include a dielectric material, for example, silicon dioxide. The dielectric liner 112 may include a different dielectric material from the dielectric core 110, preferably a dielectric material having a higher dielectric constant than the dielectric core 110, for example, silicon nitride.

The semiconductor device 100 may yet further include a plurality of contact structures 114, 116. The contact structure 114 may be arranged over each gate electrode 102 and each doped structure 104. Each contact structure 114 may include an electrically conductive material, for example, copper or tungsten. In an embodiment of the disclosure, the contact structures 114 may be via structures.

Each contact structure 116 may be arranged in the isolation structure 108. The number of contact structures 116 in the isolation structures 108 may vary depending on the design requirements of the semiconductor device 100. For example, as illustrated, two contact structures 116 may be arranged in the isolation structure 108 that separates column $C_1$ from column $C_2$. However, some isolation structures 108 may not include the contact structures 116 therein, for example, the isolation structure 108 that separates column $C_2$ from column $C_3$. In another example, all isolation structures 108 in the semiconductor device 100 do not include any contact structures 116. In an embodiment of the disclosure, the contact structures 116 may be line structures. In another embodiment of the disclosure, the contact structures 116 may be via structures. In yet another embodiment of the disclosure, the contact structures 116 may include line structures and via structures.

The contact structures 114 may have a width $W_2$ and the contact structures 116 have a width $W_3$. The width $W_2$ and the width $W_3$ are taken to be substantially perpendicular to the lengthwise direction of the contact structures 116. In an embodiment of the disclosure, the width $W_2$ of the contact structures 114 may be substantially similar to the width $W_3$ of the contact structures 116. In another embodiment of the disclosure, the width $W_2$ of the contact structures 114 may be narrower than the width $W_3$ of the contact structures 116.

In yet another embodiment of the disclosure, the width $W_2$ of the contact structures 114 may be wider than the width $W_3$ of the contact structures 116.

The width $W_3$ of the contact structures 116 may be narrower than the width $W_1$ of the isolation structure 108. The contact structures 116 may be fully contained within their respective isolation structures 108. Similar to the contact structures 114, each contact structure 116 may include an electrically conductive material, for example, copper or tungsten. In an embodiment of the disclosure, the contact structures 114 and the contact structures 116 may include the same electrically conductive material. In another embodiment of the disclosure, the contact structures 114 and the contact structures 116 may include different electrically conductive materials.

Figure 1B:
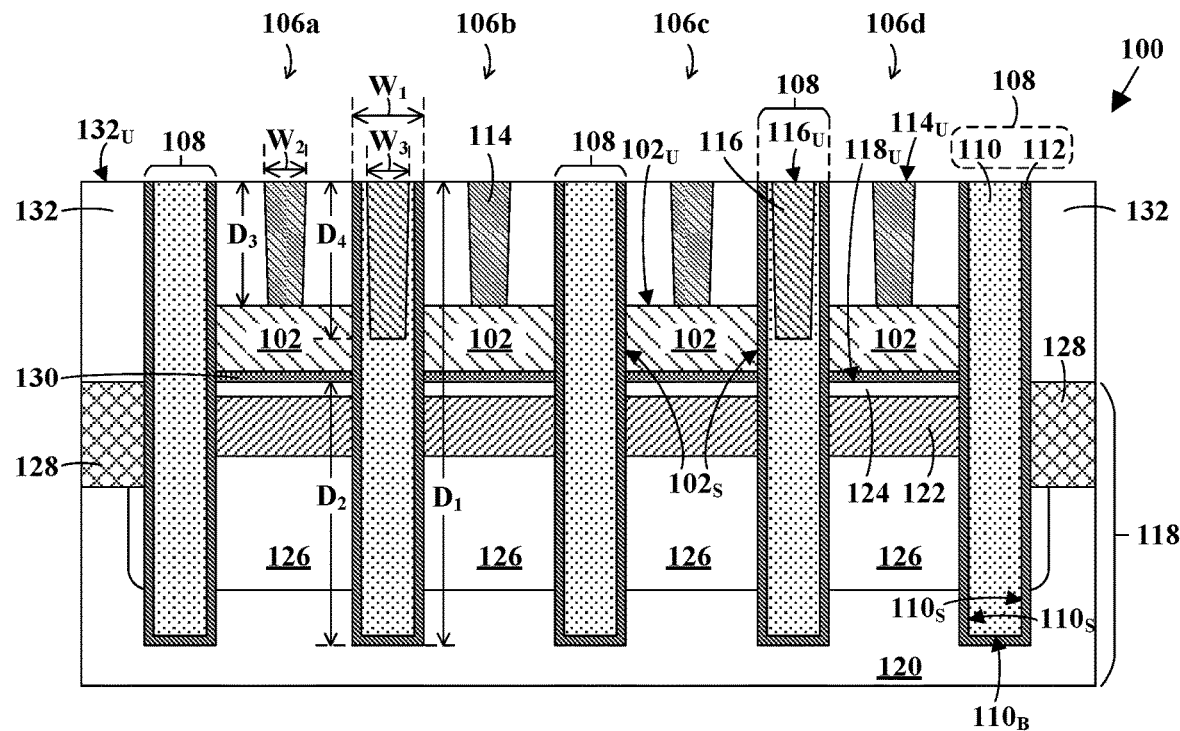
FIGS. 1B to 1C illustrate cross-sectional views of the semiconductor device in FIG. 1A, taken generally along a line A-A, according to various embodiments of the disclosure.
Figure 1C:
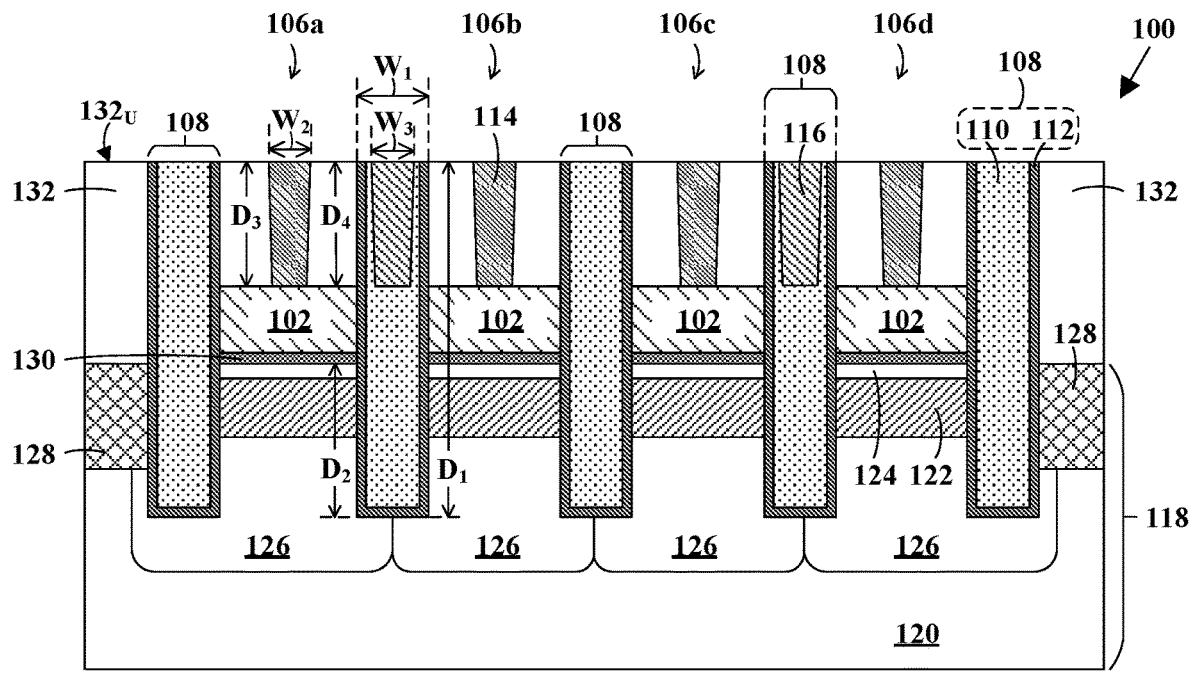

FIGS. 1B and 1C are cross-sectional views of the semiconductor device 100, taken generally along a line A-A' in FIG. 1A, according to various embodiments of the disclosure. The semiconductor device 100 may be arranged in and over a substrate 118. The substrate 118 may be a bulk semiconductor substrate. Alternatively, the substrate 118 may be a composite substrate, such as a semiconductor-on-insulator (SOI) substrate having a bulk layer 120, a buried insulator layer 122 over the bulk layer 120, and a semiconductor layer 124 over the buried insulator layer 122. The substrate 118 may include an upper substrate surface $118_U$.

The bulk layer 120 and the semiconductor layer 124 may include a semiconductor material, for example, silicon, germanium, silicon germanium, silicon carbide, or other II-VI or III-V semiconductor compounds, though not necessarily the same semiconductor material. The bulk layer 120 and the semiconductor layer 124 may be doped or undoped. The semiconductor layer 124 may also be referred to as a device layer or an active layer of the semiconductor device 100. The buried insulator layer 122 may serve to isolate the semiconductor layer 124 from the bulk layer 120 at least electrically. The buried insulator layer 122 may include an electrically insulating material, for example, silicon dioxide or aluminum oxide, and may also be referred to as a buried oxide (BOX) layer.

The semiconductor device 100 may further include a plurality of doped regions 126 in the bulk layer 120 of the substrate 118. Each doped region 126 may be arranged vertically under a corresponding gate electrode 102 and may provide either n-type conductivity or p-type conductivity. The designation of "n-type" or "p-type" is based upon the type of dopant and its conductivity in each doped region 126. For example, n-type conductivity may be provided by n-type dopants, such as arsenic, phosphorus, or antimony, and p-type conductivity may be provided by p-type dopants, such as boron, aluminum, or gallium. Each gate electrode 102 may have an upper surface $102_U$ and laterally opposite side surfaces $102_S$.

Each doped region 126 may not necessarily include the same conductivity, the same dopants, or the same dopant concentration from an immediately adjacent doped region 126. For example, each doped region 126 may include a different conductivity from an immediately adjacent doped region 126. In another example, each doped region 126 may include the same conductivity as an immediately adjacent doped region 126.

The plurality of transistors 106 may operate under different modes, and may include n-type transistors, p-type transistors, or a combination of n-type transistors and p-type transistors. For example, as illustrated, the semiconductor device 100 may include four transistors 106a, 106b, 106c, and 106d, and each transistor 106a, 106b, 106c, and 106d is either an n-type transistor or a p-type transistor. In an embodiment of the disclosure, the transistor 106a may operate under the same mode as the immediately adjacent transistor 106b, for example, the transistor 106a and the transistor 106b are n-type transistors or p-type transistors. In another embodiment of the disclosure, the transistor 106a may operate under a different mode from the immediately adjacent transistor 106b, for example, the transistor 106a is an n-type transistor and the transistor 106b is a p-type transistor, or vice versa.

Depending on the modes of operation of the transistors 106, the corresponding doped regions 126 under the respective gate electrodes 102 may include different conductivities, either n-type conductivity or p-type conductivity. For example, where an n-type transistor is desired, the doped region 126 vertically under the corresponding gate electrode 102 has p-type conductivity. In another example, where a p-type transistor is desired, the doped region 126 vertically under the corresponding gate electrode 102 has n-type conductivity.

The semiconductor device 100 may also include a trench isolation structure 128. The trench isolation structure 128 may surround the array of gate electrodes 102 and doped structures 104, as illustrated in FIG. 1A. The trench isolation structure 128 may extend at least through the semiconductor layer 124. For example, the trench isolation structure 128 may terminate within the bulk layer 120. In another example, the trench isolation structure 128 may terminate within the buried insulator layer 122 of the substrate 118. In an embodiment of the disclosure, the trench isolation structure 128 may also be referred to as a shallow trench isolation (STI) structure.

A plurality of gate insulating layers 130 may be arranged between the gate electrodes 102 and the semiconductor layer 124 of the substrate 118. For example, each transistor 106a, 106b, 106c, or 106d may include a gate insulating layer 130 arranged under their corresponding gate electrode 102, among other things. The gate insulating layers 130 may include an electrically insulative material, for example, silicon dioxide, or an electrically insulative material having a dielectric constant higher than silicon dioxide, for example, hafnium dioxide.

A dielectric layer 132 may be arranged over the substrate 118, the gate electrodes 102, and the trench isolation structure 128. The dielectric layer 132 may include an upper dielectric surface $132_U$. The dielectric layer 132 may include an electrically insulative material, for example, silicon dioxide, carbon-doped silicon dioxide, tetraethoxysilane (TEOS), borophosphosilicate glass (BPSG), undoped silicate glass (USG), or amorphous silicon. The dielectric layer 132 may be referred to as a pre-metal dielectric layer.

An upper portion of each isolation structure 108 may be arranged in the dielectric layer 132, while a lower portion thereof may be arranged in the substrate 118. Each isolation structure 108 may extend from the upper dielectric surface $132_U$ of the dielectric layer 132 and terminate within the substrate 118 with a depth $D_1$. For example, the isolation structures 108 may extend through the doped regions 126 and terminate within the bulk layer 120 of the substrate 118, as illustrated in FIG. 1B. In another example, the isolation structures 108 may terminate within the plurality of doped regions 126, as illustrated in FIG. 1C. In an embodiment of the disclosure, each isolation structure 108 may extend to a depth $D_2$ within the substrate 118 from the upper substrate surface $118_U$, and the depth $D_2$ may be in the range of about 200 nm to about 300 nm.

As mentioned above, each isolation structure 108 may include a dielectric core 110 and a dielectric liner 112 surrounding the dielectric core 110. The dielectric liner 112 may be conformal and may be arranged on at least the side surfaces $110_S$ of the dielectric core 110. In an embodiment of the disclosure, the dielectric liner 112 may be continuous, lining the side surfaces $110_S$ and the base 110E of the dielectric core 110, acquiring a "U-shaped" profile.

The contact structures 114 may also be arranged in the dielectric layer 132. Each contact structure 114 may have an upper surface $114_U$ and the upper surface $114_U$ may be substantially coplanar with the upper dielectric surface $132_U$ of the dielectric layer 132. The upper surface $114_U$ of each contact structure 114 may also be substantially coplanar with the upper surface $116_U$ of each contact structure 116.

The contact structures 114 may extend from the upper surface $114_U$ thereof to the upper surface $102_U$ of the gate electrodes 102 with a depth $D_3$. The contact structures 116 may also extend from the upper surface $116_U$ thereof to a depth $D_4$. The depth $D_4$ of the contact structures 116 may be at least equal to the depth $D_3$. For example, as illustrated in FIG. 1B, the depth $D_4$ may extend to a level lower than the upper surface $102_U$ of the gate electrode 102 such that the depth $D_4$ may be deeper than the depth $D_3$. In another example, as illustrated in FIG. 1C, the depth $D_4$ may be substantially similar to the depth $D_3$. In an embodiment of the disclosure, the depth $D_4$ of the contact structures 116 may be in the range of about 10 nm to about 300 nm.

As mentioned above, the contact structures 116 may be fully contained within their respective isolation structures 108. The contact structures 116 may be laterally spaced from the dielectric layer 132 by at least a portion of the dielectric liner 112. In an embodiment of the disclosure, the contact structures 116 may be laterally spaced from the dielectric layer 132 by a portion of the dielectric liner 112 and a portion of the dielectric core 110 of the isolation structure 108.

Figure 2:
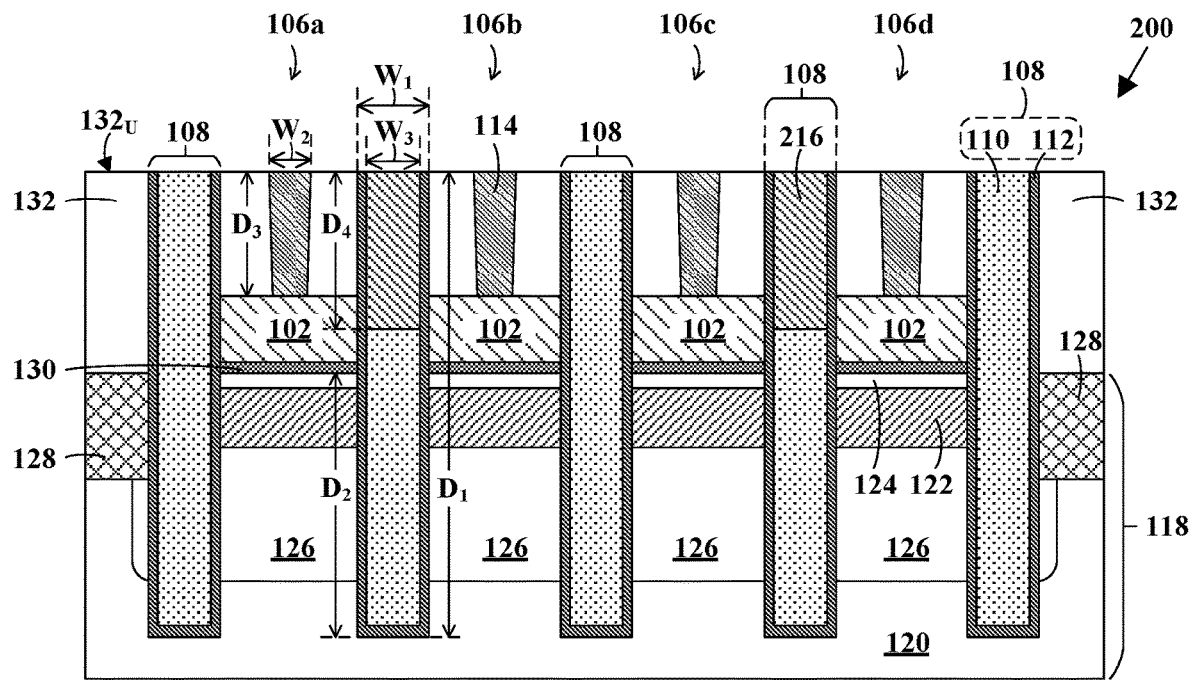
FIG. 2 illustrates a cross-sectional view of a semiconductor device, according to an alternative embodiment of the disclosure.

FIG. 2 illustrates a cross-sectional view of a semiconductor device 200, according to an alternative embodiment of the disclosure. The semiconductor device 200 may be similar to the semiconductor device 100, and thus common features are labeled with the same reference numerals and need not be separately discussed.

The semiconductor device 200 may include contact structures 216 in the isolation structures 108. The contact structure may be laterally spaced from the dielectric layer 132 by only a portion of the dielectric liner 112. In an embodiment of the disclosure, the width $W_3$ of the contact structures 216 may be wider than the width $W_2$ of the contact structures 114.

FIGS. 3A to 3D are cross-sectional views of the semiconductor device 100, illustrating a processing method of forming the isolation structures 108 therein, according to an embodiment of the disclosure. Certain structures may be conventionally fabricated, for example, using known processes and techniques, and specifically disclosed processes and methods may be used to achieve individual aspects of the present disclosure.

Figure 3A:
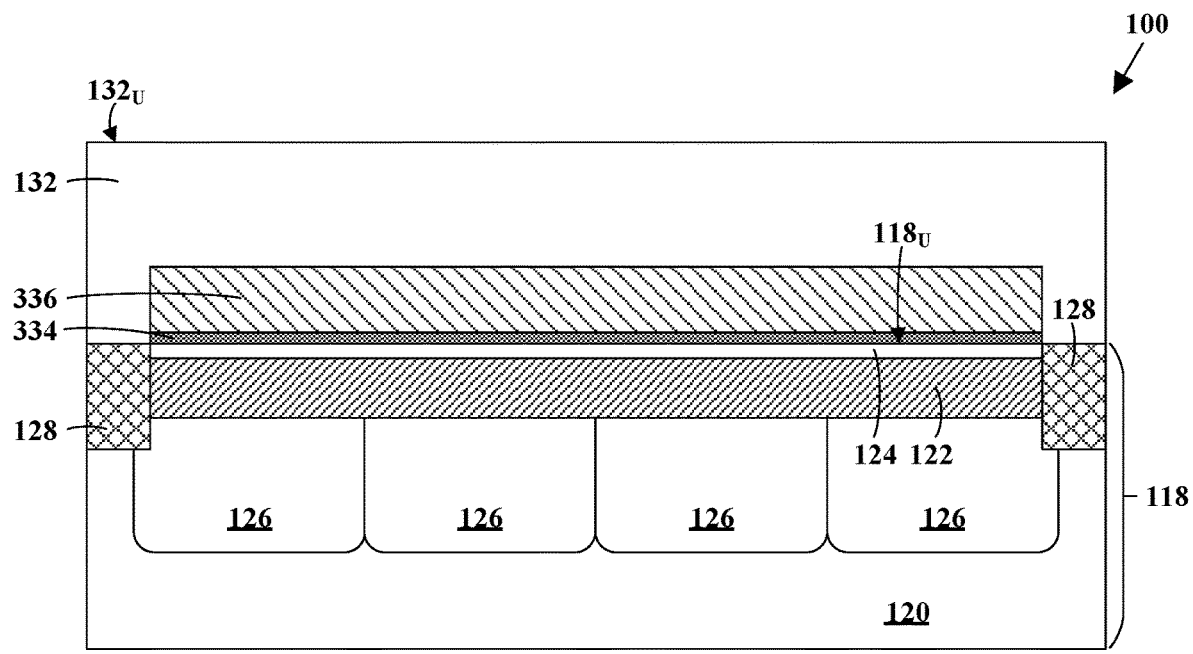
FIGS. 3A to 3D are cross-sectional views of a semiconductor device, illustrating a processing method of forming isolation structure therein, according to an embodiment of the disclosure.

FIG. 3A illustrates the semiconductor device 100 at an initial fabrication stage of a processing method, according to an embodiment of the disclosure. Depending on the design requirements of the semiconductor device 100 and the type of transistors to be formed, at least one doped region 126 may be formed in the bulk layer 120 of the substrate 118. For example, as illustrated, four doped regions 126 may be formed in the bulk layer 120 of the substrate 118. The doped regions 126 may be formed by introducing dopants using a doping technique, for example, an ion-implantation process. The doped regions 126 may not necessarily include the same conductivity, the same dopants, or the same dopant concentration as an immediately adjacent doped region 126.

A trench isolation structure 128 may be used to define regions where various semiconductor devices may be formed therein and thereupon the substrate 118. The trench isolation structure 128 may be formed using a patterning technique, including lithography and etching processes, to form a trench (not shown) in the substrate 118. The trench may at least extend through the semiconductor layer 124 of the substrate 118. Subsequently, the trench may be filled with an electrically insulative material, for example, silicon dioxide. A planarization technique, including a chemical-mechanical planarization process, may be performed to form a substantially planar top surface over the trench isolation structure 128 and the substantially planar top surface may be substantially coplanar with the upper surface $118_U$ of the substrate 118.

A layer of gate insulating material 334 and a layer of gate electrode material 336 may be sequentially deposited over the substrate 118. The layer of gate insulating material 334 and the layer of gate electrode material 336 may be deposited using a deposition technique, including a chemical vapor deposition (CVD) process or a physical vapor deposition (PVD) process, and subsequently patterned using a patterning technique, including lithography and etching processes.

Although not shown in FIG. 3A, doped structures may be formed at laterally opposite sides of the layer of gate electrode material 336; the doped structures are into and out of the page of the accompanying drawings and are synonymous with the doped structures 104 in FIG. 1A. In an embodiment of the disclosure, the doped structures may be formed in the semiconductor layer 124 of the substrate 118 by a doping technique, including an ion implantation process. In another embodiment of the disclosure, the doped structures may be formed by a deposition technique, including an epitaxial process, and the dopants may be introduced into the doped structures by a doping technique, including an ion implantation process, or during the deposition technique by an in-situ process.

A dielectric layer 132 may be deposited over the substrate 118, the trench isolation structure 128, the layer of gate electrode material 336, and the doped structures. The dielectric layer 132 may be deposited using a deposition technique, including a CVD process. The dielectric layer 132 has an upper dielectric surface $132_U$.

Figure 3B:
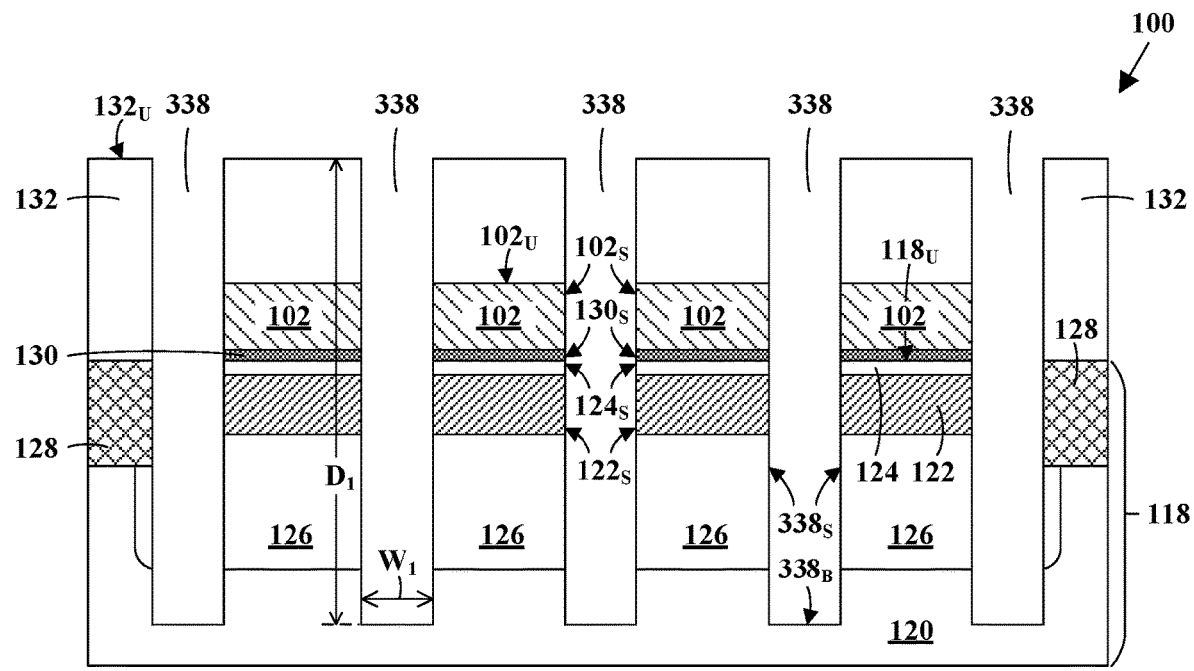

FIG. 3B is a cross-sectional view of the semiconductor device 100 at a fabrication stage subsequent to FIG. 3A, according to an embodiment of the disclosure. Trenches 338 may be formed partially through the substrate 118. Each trench 338 has a base $338_B$ and laterally opposite side surfaces $338_S$, and a width $W_1$ between the side surfaces $338_S$.

The trenches 338 may extend from the upper dielectric surface $132_U$ of the dielectric layer 132 to a depth $D_1$ within the substrate 118. For example, the trenches 338 may at least extend through the layer of gate electrode material 336 and the layer of gate insulating material 334, and consequently divide the layer of gate electrode material 336 and the layer of gate insulating material 334 into a plurality of gate electrodes 102 and a plurality of gate insulating layers 130, respectively. The trenches 338 may be formed using a patterning technique, including lithography and etching processes.

Each side surface $338_S$ of the trenches 338 may expose the side surface $102_S$ of the gate electrode 102, the side surface $130_S$ of the gate insulating layer 130, the side surface $124_S$ of the semiconductor layer 124 of the substrate 118, and the side surface $122_S$ of the buried insulator layer 122 of the substrate 118. A portion of the substrate 118 may be exposed in the lower portion of each trench 338. In an embodiment of the disclosure, the side surface $102_S$, the side surface $130_S$, the side surface $124_S$, and the side surface $122_S$ may be substantially coplanar with each other.

As mentioned above, the doped structures that are synonymous with the doped structures 104 in FIG. 1 may be formed at laterally opposite sides of the layer of gate electrode material 336 (into and out of the page of the accompanying drawings). The trenches 338 may also extend through the doped structures during the patterning technique.

Figure 3C:
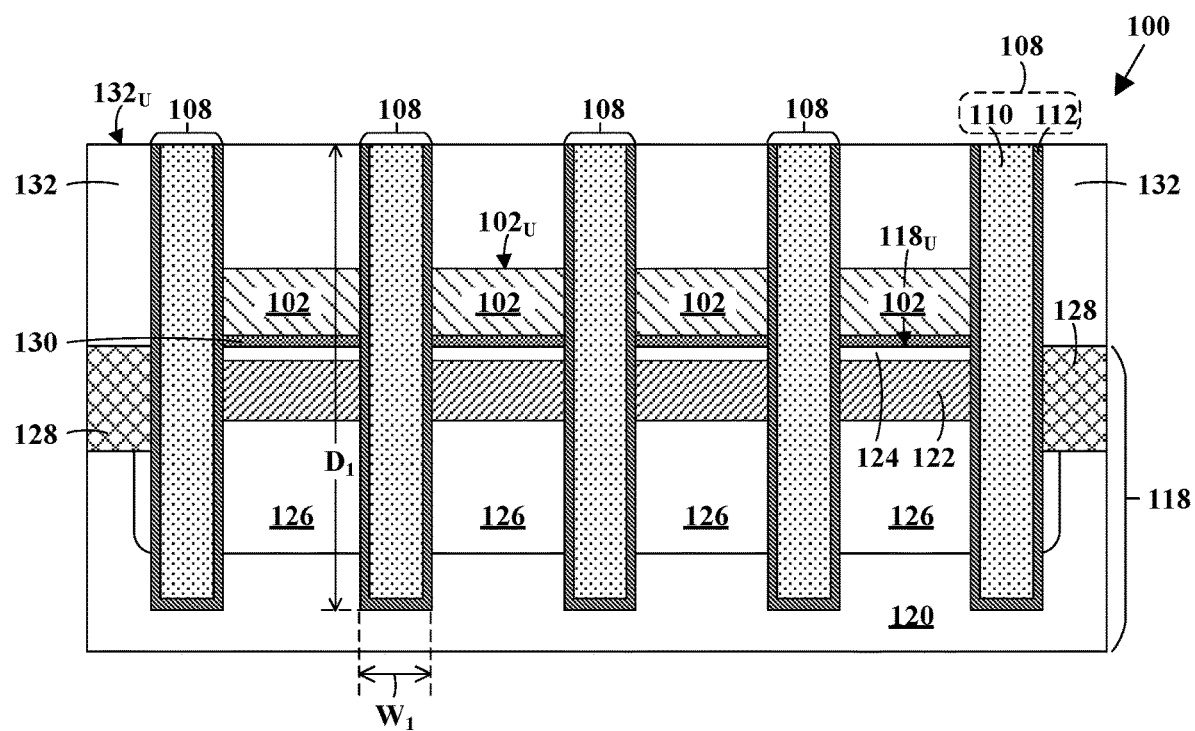

FIG. 3C is a cross-sectional view of the semiconductor device 300 at a fabrication stage subsequent to FIG. 3B, according to an embodiment of the disclosure. A dielectric liner 112 and a dielectric core 110 may be formed in the trenches 338.

A layer of dielectric liner material may be conformally deposited in the trenches 338, lining the side surfaces $338_S$ and the base $338_B$ thereof. The layer of dielectric liner material may be continuous and in contact with the side surfaces $102_S$ of the gate electrodes 102, the side surfaces $130_S$ of the gate insulating layers 130, the side surfaces $124_S$ of the semiconductor layer 124, and the side surfaces $122_S$ of the buried insulator layer 122. The layer of dielectric liner material may further overlay the upper dielectric surface $132_U$ of the dielectric layer 132.

A layer of dielectric core material may be subsequently deposited over the layer of dielectric liner material to at least fill the trenches 338. The layer of dielectric liner material and the layer of dielectric core material may be deposited using a deposition technique, including a CVD process. The layer of dielectric liner material and the layer of dielectric core material may be subsequently planarized using a planarization technique, including a chemical-mechanical planarization (CMP) process, to form the dielectric liner 112 and the dielectric core 110, respectively, in the trenches 338. The planarization technique also achieves the formation of upper surfaces of the dielectric liner 112 and the dielectric core 110 that are substantially coplanar with each other.

The dielectric liner 112 and the dielectric core 110 may form an isolation structure 108 in each trench 338. In an embodiment of the disclosure, the upper surface of the dielectric liner and the dielectric core may be substantially coplanar with the upper dielectric surface $132_U$ of the dielectric layer 132.

Figure 3D:
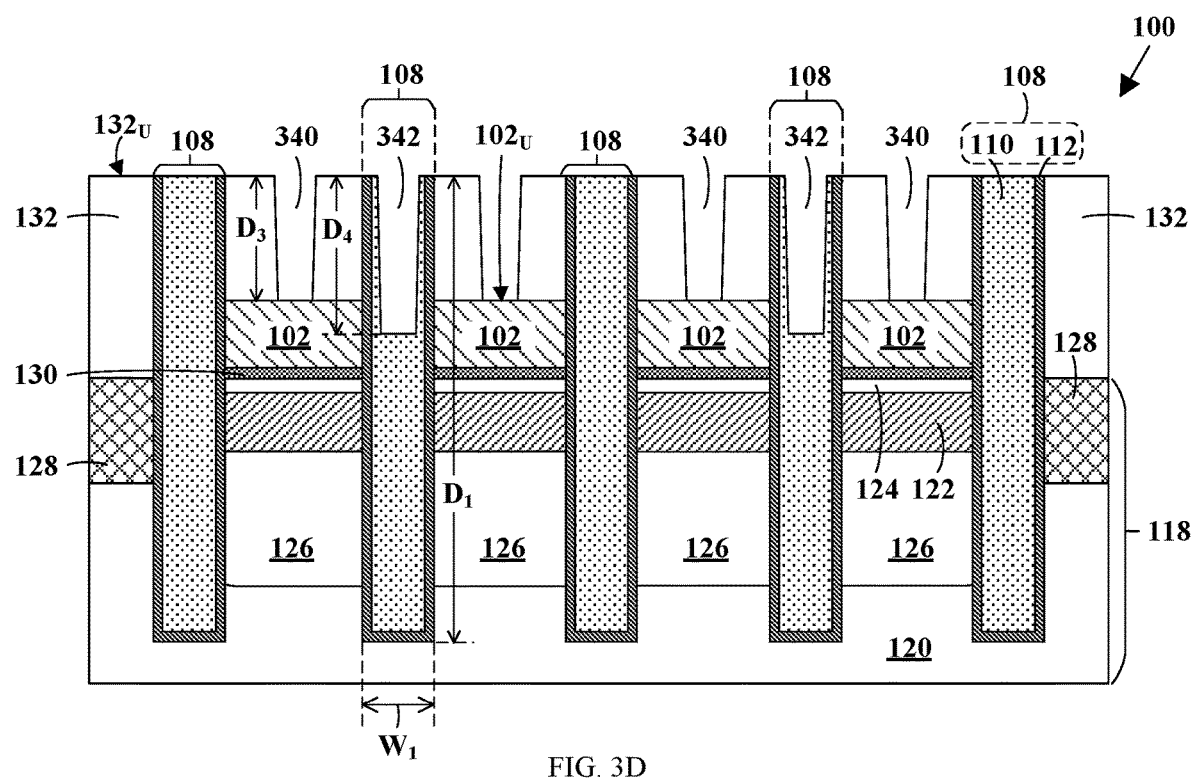

FIG. 3D is a cross-sectional view of the semiconductor device 100 at a fabrication stage subsequent to FIG. 3C, according to an embodiment of the disclosure. Openings 340, 342 may be formed in the dielectric layer 132 and the isolation structures 108, respectively, using a patterning technique, including lithography and etching processes. The openings 340, 342 may be formed concurrently or in separate processing steps.

The openings 340 formed in the dielectric layer 132 may extend to a depth $D_3$ from the upper dielectric surface $132_U$ of the dielectric layer 132 and expose a portion of the gate electrodes 102 therein. The openings 342 formed in the dielectric cores 110 may extend to a depth $D_4$ from the upper dielectric surface $132_U$ of the dielectric layer 132 and may terminate within the dielectric cores 110 such that a portion of the dielectric core 110 may be arranged under each opening 342. The depth $D_4$ may be at least as deep as the depth $D_3$. Although not shown in FIG. 3D, openings may also be formed in the dielectric layer 132 over the doped structures and portions of the doped structures may be exposed therein.

Processing continues with the formation of contact structures 114, 116 in the openings 340, 342, respectively. The openings 340 formed over the gate electrodes 102 may be subsequently filled with an electrically conductive material to form the contact structures 114. The openings 342 formed in the isolation structures 108 may also be subsequently filled with an electrically conductive material to form contact structures 116 for electrical routing purposes of the semiconductor device 100. The filling of the openings 340, 342 may be performed concurrently or in separate processing steps.

The electrically conductive material may be deposited using a deposition technique, including a PVD process. A planarization technique, including a chemical-mechanical planarization process, may be performed to form a substantially planar upper surface over each contact structure 114, 116 and the substantially planar upper surfaces may be substantially coplanar with the upper dielectric surface $132_U$ of the dielectric layer 132.

As presented above, various embodiments of isolation structures of semiconductor devices and methods of forming the same are presented. The isolation structures enable the formation of a compact semiconductor device including closely packed transistors to achieve further miniaturization of IC chips while delivering greater device performance. Contact structures may be arranged in the isolation structures to improve electrical routing of the semiconductor devices.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of features is not necessarily limited to those features but may include other features not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about," or "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of 90 degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of features and methods of fabrication described in an exemplary embodiment without departing from the scope of this disclosure as set forth in the appended claims.

What is claimed is:

1. A semiconductor device, comprising:
    a substrate including:
        a bulk layer;
        a buried insulator layer over the bulk layer; and
        a semiconductor layer over the buried insulator layer;
    a first gate electrode over the substrate;
    a second gate electrode laterally adjacent to the first gate electrode; and
    an isolation structure in contact with the first gate electrode and the second gate electrode, and the isolation structure extends into the substrate and terminates within the bulk layer thereof.

2. The semiconductor device of claim 1, wherein the bulk layer of the substrate comprises a doped region, and the isolation structure extends through the doped region.

3. The semiconductor device of claim 1, wherein the bulk layer of the substrate comprises a doped region, and the isolation structure terminates within the doped region.

4. The semiconductor device of claim 1, wherein the buried insulator layer has a first side surface, the semiconductor layer has a second side surface, the first gate electrode has a third side surface, and the first side surface, the second side surface, and the third side surface are substantially coplanar with each other.

5. The semiconductor device of claim 1, wherein the isolation structure comprises:
    a dielectric core having laterally opposite side surfaces; and
    a dielectric liner at least on the laterally opposite side surfaces of the dielectric core.

6. The semiconductor device of claim 5, wherein the dielectric core comprises a first dielectric material and the dielectric liner includes a second dielectric material having a higher dielectric constant than the first dielectric material.

7. The semiconductor device of claim 1, further comprising:
a first contact structure over the first gate electrode, the first contact structure having a first upper surface; and
a second contact structure in the isolation structure, the second contact structure having a second upper surface, and the first upper surface and the second upper surface are substantially coplanar with each other.

8. The semiconductor device of claim 7, wherein the first contact structure has a first depth from the first upper surface thereof and the second contact structure has a second depth from the second upper surface thereof, and the second depth is deeper than the first depth.

9. The semiconductor device of claim 7, further comprising:
a dielectric layer over the substrate, wherein the first contact structure, the second contact structure, and a portion of the isolation structure are arranged in the dielectric layer.

10. A semiconductor device, comprising:
a substrate;
a plurality of first gate electrodes arranged within a first column over the substrate;
a plurality of first doped structures arranged in an alternating arrangement configuration of a first doped structure and a first gate electrode within the first column;
a plurality of second gate electrodes arranged within a second column over the substrate, the second column is adjacent to the first column;
a plurality of second doped structures arranged in an alternating arrangement configuration of a second doped structure and a second gate electrode within the second column; and
an isolation structure in a third column separating the first column from the second column, wherein the isolation structure is laterally in direct contact with the plurality of first gate electrodes and the plurality of first doped structures in the first column, and with the plurality of second gate electrodes and the plurality of second doped structures in the second column, and the isolation structure extends into the substrate.

11. The semiconductor device of claim 10, further comprising:
a first contact structure over each first gate electrode of the plurality of first gate electrodes, each first contact structure having a first upper surface; and
a second contact structure over each second gate electrode of the plurality of second gate electrodes, each second contact structure having a second upper surface, and the second upper surface is substantially coplanar with the first upper surface.

12. The semiconductor device of claim 11, further comprising:
a third contact structure in the isolation structure, the third contact structure having a third upper surface, and the third upper surface is substantially coplanar with the first upper surface and the second upper surface.

13. The semiconductor device of claim 10, wherein the substrate comprises:
a bulk layer;
a buried insulator layer over the bulk layer; and
a semiconductor layer over the buried insulator layer, and the isolation structure terminates within the bulk layer of the substrate.

14. A method of forming a semiconductor device, comprising:
forming a first gate electrode and a second gate electrode over a substrate, the second gate electrode is laterally adjacent to the first gate electrode, wherein the substrate includes:
a bulk layer;
a buried insulator layer over the bulk layer; and
a semiconductor layer over the buried insulator layer; and
forming an isolation structure between the first gate electrode and the second gate electrode, the isolation structure extends into the substrate and is in direct contact with the first gate electrode and the second gate electrode at laterally adjacent sides thereof, wherein the isolation structure terminates within the bulk layer of the substrate.

15. The method of claim 14, wherein forming the first gate electrode and the second gate electrode comprises:
depositing a layer of gate electrode material over the substrate; and
forming a trench through the layer of gate electrode material to a level within the substrate, exposing side surfaces of the first gate electrode and the second gate electrode in the trench.

16. The method of claim 15, wherein forming the trench further comprising:
extending the trench through a semiconductor layer and a buried insulator layer of the substrate, the buried insulator layer is under the semiconductor layer, wherein the trench terminates within a bulk layer that is under the buried insulator layer, and at least side surfaces of the semiconductor layer and the buried insulator layer are exposed in the trench.

17. The method of claim 15, further comprising:
depositing a first dielectric material to partially fill the trench, the first dielectric material is conformal to the trench;
depositing a second dielectric material to at least fill the trench, the second dielectric material is different from the first dielectric material; and
performing a planarization process to form the isolation structure in the trench, the isolation structure comprises a dielectric liner formed from the first dielectric material and a dielectric core formed from the second dielectric material, wherein the dielectric liner and the dielectric core have upper dielectric surfaces substantially coplanar with each other.

18. The method of claim 17, further comprising:
depositing a dielectric layer over the layer of gate electrode material before forming the trench, the dielectric layer having an upper dielectric surface, and the upper dielectric surfaces of the dielectric liner and the dielectric core are substantially coplanar with the upper dielectric surface of the dielectric layer.

19. The method of claim 18, further comprising:
forming a first opening in the dielectric layer over the first gate electrode and a second opening in the dielectric core of the isolation structure; and
filling the first opening and the second opening with a conductive material to form a first contact structure over the first gate electrode and a second contact structure in the isolation structure, respectively.

* * * * *